United States Patent [19]

Lange

[11] Patent Number: 4,542,481
[45] Date of Patent: Sep. 17, 1985

[54] ONE-DEVICE RANDOM ACCESS MEMORY CELL HAVING ENHANCED CAPACITANCE

[75] Inventor: Russell C. Lange, Wappingers Falls, N.Y.

[73] Assignee: International Business Machines Corporation, Armonk, N.Y.

[21] Appl. No.: 462,646

[22] Filed: Jan. 31, 1983

[51] Int. Cl.[4] .............................................. G11C 11/24
[52] U.S. Cl. ....................................... 365/149; 357/41
[58] Field of Search ............... 365/149, 174; 357/23 C, 357/23 CS, 41, 51

[56] References Cited

U.S. PATENT DOCUMENTS

| 4,141,027 | 2/1979 | Baldwin et al. | 357/51 |
| 4,163,243 | 7/1979 | Kamins et al. | 357/41 |
| 4,164,751 | 8/1979 | Tasch, Jr. | 357/41 |
| 4,225,945 | 9/1980 | Kuo | 365/149 |
| 4,240,092 | 12/1980 | Kuo | 357/41 |
| 4,259,729 | 3/1981 | Tokushige | 365/149 |
| 4,423,490 | 12/1983 | Roesner | 365/149 |

OTHER PUBLICATIONS

IBM Technical Disclosure Bulletin, vol. 19, No. 2, Jul. 1976, "One-Device Storage Cell with Implanted Storage Node", S. P. Klepner, pp. 458-459.

Primary Examiner—Joseph A. Popek
Attorney, Agent, or Firm—Robert J. Haase; Mitchell S. Bigel

[57] ABSTRACT

An improved one-device random access memory cell comprises a transistor and a capacitor, with one of the transistor's controlled electrodes being connected to one of the capacitor plates to form a storage node. The storage node is maintained at either a first or a second voltage level depending upon the binary state of the cell.

The other capacitor plate is connected to a voltage level which is approximately midway between the first and second voltage levels so that the maximum voltage across the capacitor is reduced to one half the voltage of prior art cells wherein the other capacitor plate was grounded or maintained at the memory power supply voltage level. By halving the maximum voltage across the capacitor, the capacitor dielectric thickness may be halved to thereby double the capacitance per unit area without exceeding the capacitor dielectric breakdown field strength.

8 Claims, 4 Drawing Figures

ONE-DEVICE RANDOM ACCESS MEMORY CELL HAVING ENHANCED CAPACITANCE

DESCRIPTION

1. Technical Field

This invention generally relates to an improved random access memory cell and more particularly to a random access memory cell which comprises a single active device and a charge storage device.

Random access memories are widely employed for storing binary data in a data processing system. Typically, a random access memory comprises an array of cells arranged in a predetermined number of words, each word comprising a predetermined number of cells, with one bit being stored per cell. Data is typically written into or read from the memory by selecting one word and writing or reading all of the cells in the selected word.

State of the art data processing applications require ever increasing processing speeds coupled with reduced processor size and power consumption. As such, the design of random access memories has focused on increasing read/write speed, decreasing cell size and reducing power consumption.

2. Background Art

One currently favored class of random access memory employs the so-called "one-device" cell. The one-device cell has found favor among memory designers because of its small cell size, high speed, and low power dissipation. Basically, the one-device cell includes a single active device (typically a bipolar or field effect transistor) and a single charge storage device (typically a capacitor). The active device's controlling electrode (i.e., the base or gate) is connected to a word line for selecting the cell. One of the active device's controlled electrodes (i.e., the bipolar transistor's emitter or collector or the field effect transistor's drain or source) is connected to one of the capacitor plates. The other capacitor plate is connected to a fixed potential, typically ground or the memory power supply voltage. Finally, the other of the active device's controlled electrodes is connected to a bit line. A sense amplifier is also connected to the bit line for sensing the binary data stored in the cell.

The binary state of the one-device cell is determined by the charge stored on the capacitor thereof. For example, the absence of charge on the capacitor may signify a logical ZERO while the presence of charge on the capacitor may signify a logical ONE. During the standby state, the controlling electrode (i.e., the base or gate) is disabled so that the active device is off, and acts as a high impedance to prevent capacitor discharge. Data is read (sensed) by turning on the active device, which permits the capacitor to discharge onto the bit line to which the active device is connected. This charge is sensed by the sense amplifier connected to the bit line.

State of the art memory designs have attempted to integrate as many cells as possible on a chip by decreasing the size of the individual cells. One-device cell size may be decreased by decreasing the area of the one device cell capacitor. However, it is well known that decreasing the capacitor area will decrease the capacitance and decrease the charge stored on the capacitor. Since the charge stored on present day one-device cells is already at the minimum level required for reliable sensing, a further decrease in stored charge is unacceptable.

The capacitor area may be decreased without decreasing the charge stored thereon by increasing the capacitance per unit area. It is well known that for a given capacitor dielectric, the capacitance per unit area may be increased by decreasing the dielectric thickness. Unfortunately, decreasing the dielectric thickness will increase the dielectric field strength. Since the dielectric field strength of present day one-device cell is already at the maximum level, above which dielectric breakdown will occur, a further increase in dielectric field strength is unacceptable.

DISCLOSURE OF THE INVENTION

It is therefore a primary object of this invention to provide an improved one-device cell.

It is another object of the invention to provide a one-device memory which is of higher density than heretofore available.

It is a further object of the invention to provide a one-device memory, the capacitors of which occupy minimal area and provide the requisite charge storage without exceeding the capacitor breakdown voltage.

These and other objects are accomplished by a one-device cell comprising a transistor (e.g., a field effect transistor) having a controlling (gate) electrode and a pair of controlled (source and drain) electrodes and a charge storage device (e.g., a capacitor) having a pair of plates. One of the controlled electrodes are connected to one of the capacitor plates at a storage node. The storage node is maintained at either a first voltage level or a second voltage level depending upon the binary state of the cell. The other capacitor plate is connected to a voltage level which is approximately midway between the first and second voltage levels. This contrasts with prior art one-device cells wherein the other capacitor plate was grounded (or connected to the memory power supply voltage).

By connecting the other capacitor plate to a voltage level which is approximately midway between the first and second voltage levels, the maximum voltage across the capacitor is reduced to one-half the difference between the first and second levels. This contrasts with prior art (grounded plate) one-device cells wherein the maximum voltage across the capacitor is the full difference between the first or second levels. Since the maximum voltage across the capacitor is reduced by a factor of two, the dielectric thickness may be halved without exceeding the dielectric breakdown field strength. Thus, double the capacitance may be obtained per unit area, so that the capacitor area may be halved, and a double density memory obtained. Alternatively, the capacitor area may be maintained the same as a grounded plate cell, so that double the charge is stored and the cell noise margin is doubled.

In a preferred embodiment of the invention the one-device cell includes an insulated gate field effect transistor (IGFET, also referred to as metal oxide semiconductor field effect transistor or MOSFET) having source and drain regions and a channel region therebetween. A gate electrode overlies the channel region and is separated therefrom by a first dielectric (e.g., oxide) layer. The one-device cell capacitor includes a pair of plates having a second dielectric (e.g., oxide) therebetween. One capacitor plate is connected to the source or drain at a storage node. The binary state of the one-device cell is indicated by the voltage at the storage node, e.g.; for binary ZERO, zero volts is stored at the storage node, while for binary ONE, $V_{DD}-V_T$ volts is stored thereat, where $V_{DD}$ is the memory power supply voltage and assumed to be the word line voltage, and $V_T$ is the field effect transistor threshold voltage.

According to the invention, the other capacitor plate is connected to a voltage source having a value midway between the storage node voltage levels, i.e.; $(V_{DD}-V_T)/2$. Thus, the maximum voltage across the capacitor is $\pm(V_{DD}-V_T)/2$. This contrasts with a grounded plate cell wherein the maximum voltage would be $V_{DD}-V_T$. Thus, the capacitor dielectric thickness may be half the gate dielectric thickness, while still meeting dielectric breakdown requirements. Since the capacitor dielectric thickness is halved, the capacitance is doubled. Therefore, either twice the charge may be stored on the capacitor compared to a grounded plate cell, or the capacitor area may be halved thereby doubling memory density.

A process for fabricating integrated circuit one-device cells of the present invention is also disclosed. The process includes the steps of growing a first oxide layer over the channel and capacitor plate regions and removing the first oxide over the capacitor plate region. A second oxide layer of same thickness as the first oxide layer is grown over the first oxide layer in the channel region and over the capacitor plate region. Thus, a gate oxide region having twice the thickness of the capacitor oxide region is formed.

BEST MODE FOR CARRYING OUT THE INVENTION

Figure 1:
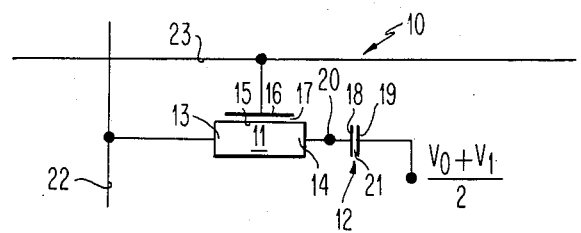
FIG. 1 illustrates a circuit diagram of the one-device cell of the present invention.

Referring now to FIG. 1, a circuit diagram of the one-device cell of the present invention is illustrated. One-device cell 10 includes IGFET 11 and capacitor 12. IGFET 11 includes a source 13, drain 14 and channel 15 therebetween. Gate 16 overlies channel 15 and is separated therefrom by gate oxide 17. Capacitor 12 includes first and second plates 18 and 19, respectively, having capacitor oxide 21 therebetween.

IGFET 11 and capacitor 12 are connected to form a one-device cell as follows: Source 13 is connected to bit line 22 while gate 16 is connected to word line 23. Drain 14 is connected to first capacitor plate 18 at storage node 20. It will be understood by those having skill in the art that the connection of source and drain regions (13 and 14, respectively) may be reversed, i.e., drain 14 may be connected to bit line 22 while source 13 may be connected to storage node 18.

In accordance with the present invention, second capacitor plate 19 is connected to a source of potential having a value which is midway between the two voltage levels assumed by storage node 20. More particularly, if the binary voltages at storage node 20 are $V_0$ and $V_1$ for binary ZERO and ONE, respectively, then plate 19 is connected to a voltage of $(V_0+V_1)/2$. This contrasts with prior art one-device cells wherein plate 19 was typically grounded, or at $V_{DD}$.

Operation of the one-device cell of FIG. 1 will now be described. As understood by those having skill in the art, the one-device cell may operate using various voltage levels. The present example merely illustrates one method of operation, and shows how the one-device cell of the present invention provides the requisite charge storage with minimal capacitor area while not exceeding the capacitor breakdown voltage.

During the standby mode, FET 11 is turned off by maintaining word line 23 at 0V. Bit line 22 is maintained at a high voltage level (e.g., at the memory power supply voltage level $V_{DD}$). The binary state of the cell is determined by the charge stored on capacitor 12. For binary ZERO, storage node 20 is at voltage level $V_0$ (e.g., zero volts) while for binary ONE storage node 20 is at voltage level $V_1$ (e.g., $V_{DD}$ less the FET's threshold voltage $V_T$).

In accordance with the present invention, plate 19 is maintained at voltage midway between $V_0$ and $V_1$, here $(V_{DD}-V_T)/2$. Thus, for stored ZERO, the voltage across the capacitor is $-(V_{DD}-V_T)/2$ and for stored ONE the voltage across the capacitor is $(V_{DD}-V_T)/2$. This contrasts with prior art grounded plate designs wherein the voltage across the capacitor is zero for stored ZERO and $(V_{DD}-V_T)$ for stored ONE. Likewise, this contrasts with prior art designs with plate at $V_{DD}$, wherein the voltage across the capacitor is $V_{DD}$ for stored ZERO and $V_T$ for stored ONE. Since the maximum voltage across the capacitor of the present cell is half the maximum voltage of prior art grounded plate cells, the capacitor dielectric thickness may be halved to thereby double the capacitance per unit area, without exceeding the maximum field strength. Although the maximum voltage across the capacitor of the present invention is halved, the total charge stored (which is proportional to the difference between the voltage across the capacitor for stored ONE and ZERO) is the same as the prior art grounded plate cell (i.e., $V_{DD}-V_T$), so that the noise margins are the same.

In order to write binary data into one-device cell 10, word line 23 is raised to $V_{DD}$ to turn FET 11 on. If a binary ZERO is to be written, bit line 22 is brought to zero volts to bring storage node 20 to zero volts. If binary ONE is to be written, bit line 22 is brought to $V_{DD}-V_T$ to bring storage node 20 to $V_{DD}-V_T$. Word line 23 is then brought back to zero volts to turn off FET 11.

Binary data is read from one-device cell 10 by raising word line 23 to $V_{DD}$ and floating bit line 22. Then, if storage node 20 is at zero volts (binary ZERO stored) negative charge will flow from storage node 20 through IGFET 11 and onto bit line 22. Alternatively, if node 20 is at $V_{DD}-V_T$ (binary ONE stored), then no charge will flow and no voltage change will occur on bit line 22. It will be recognized that the differential read signals for one-device cell 10 and prior art grounded plate cells are the same (i.e., $V_{DD}-V_T$) so that the noise margins of both cells are the same. It will also be noted that if gate oxide 17 is sufficiently thick to withstand a voltage of $V_{DD}-V_T$ without breakdown, capacitor oxide 21 need only be half as thick. Thus capacitance per unit area is doubled so that capacitor area may be halved.

Figure 2:
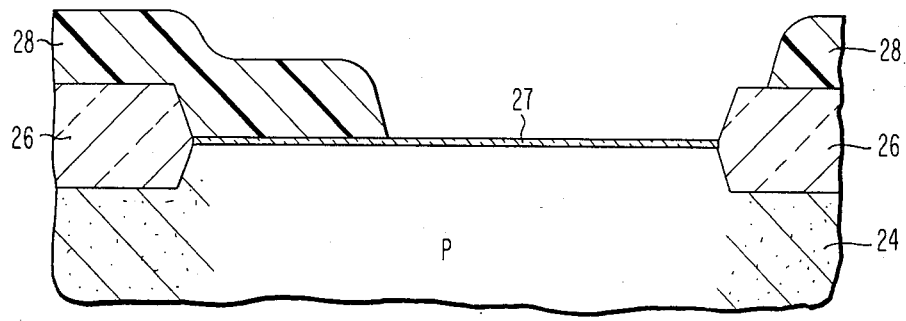
FIG. 2-4 illustrates steps for fabricating an integrated circuit embodiment of the one-device cell of FIG. 1.
Figure 3:
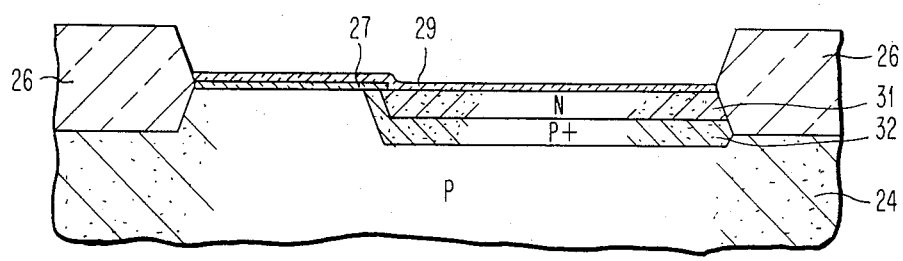
Figure 4:
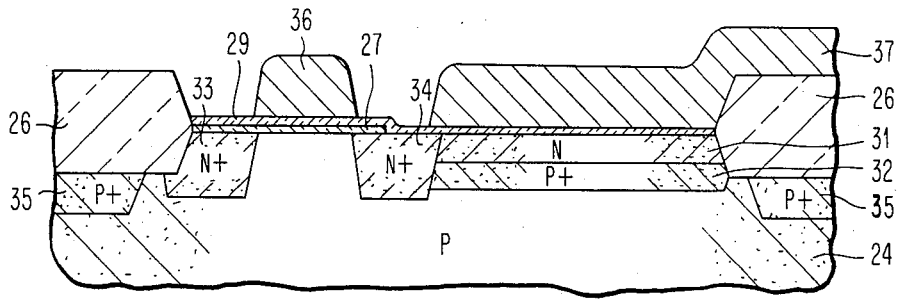

Referring now to FIGS. 2-4, a method of fabricating an integrated circuit embodiment of the one-device cell of FIG. 1 is illustrated. As shown in FIG. 2, the cell is fabricated on a P doped silicon substrate 24 although it will be recognized by those having skill in the art that an N doped substrate may be employed. Isolation regions are formed on the substrate. In the embodiment of FIG. 2, isolation regions 26 are recessed oxide isolation regions formed according to conventional processes.

However, junction or other conventional isolation processes may be used.

First oxide region 27 is then grown on P substrate 24. Oxide 27 may be formed by conventional thermal oxidation or other processes. Oxide layer 27 has thickness equal to the desired capacitor oxide thickness (i.e., half the gate oxide thickness). Photoresist mask 28 is then formed by conventional photolithographic techniques to mask that portion of first oxide layer 27 which overlies the FET gate oxide region while exposing that portion of first oxide layer 27 which overlies the capacitor oxide region.

Referring now to FIG. 3, an N doped region 31 is implanted. As will be seen below, N region 31 forms first capacitor plate 18. Optionally, P+ region 32 is implanted prior to N region 31 for providing better isolation between N region 31 and P substrate 24, and for providing increased storage capacitance. The exposed portion of first oxide layer 27 is then removed via conventional etching techniques and the photoresist 28 is removed.

Referring again to FIG. 3, second oxide layer 29 is then grown. Second oxide region 29 is of the same thickness as oxide region 27 (i.e., the desired capacitor oxide thickness) so that first oxide region 27 and the portion of second oxide region 29 lying thereon form a combined oxide layer having approximately twice the thickness of the portion of second oxide region 29 above N region 31.

Referring now to FIG. 4, conventional techniques are used to implant N+ regions 33 and 34 and optional P+ junction isolation region 35. Contacts 36 and 37 are then formed by conventional techniques. It will be recognized by those having skill in the art that contact 36 and 37 may be metal, polysilicon or other contact materials used in the art. It will also be realized that implants 33 and 34 may be done after forming contacts 36 and 37 to provide a self-aligned structure.

Comparing FIGS. 1 and 4 it will be seen that N+ region 33 corresponds to source 13 and bit line 22 while N+ region 34 corresponds to drain 14. Channel 15 lies between N+ regions 33 and 34. Contact 36 corresponds to gate 16 and word line 23. First oxide layer 27 and that portion of second oxide layer 29 lying thereon constitutes gate oxide 17. N region 31 corresponds to capacitor plate 18 while contact 37 corresponds to capacitor plate 19. That portion of second oxide layer 29 lying between contact 37 and N region 31 constitutes the capacitor oxide 21. In accordance with the invention, contact 37 is connected to a voltage source having value $(V_0+V_1)/2$.

It will be recognized by those having skill in the art that N region 31 must physically connect with N+ region 34 to form storage node 20. It will also be recognized by those having skill in the art that the process illustrated in FIGS. 2-4 forms a diffusion store capacitor comprising bottom plate 31, dielectric 29 and top plate 37. The presence of bottom plate 31 is necessary to ensure that a capacitor plate is present for charge storage under all conditions of voltage on top plate 37. An inversion store capacitor, wherein the bottom plate comprises an inverted charge region under an oxide is not usable with the present invention because an inversion region will not accept charge to raise the voltage thereon above the voltage of top plate 37. Thus, when top plate 37 is placed at $(V_{DD}-V_T)/2$, the voltage on the inversion store region cannot exceed this value. This halves the maximum voltage attained by node 18, and negates the advantage obtained by the present invention. It will also be recognized by those having skill in the art that other processes of forming one-device cells may be employed to formulate the cell of the present invention.

Whereas I have illustrated and described the preferred embodiment of the invention, it is to be understood that I do not limit myself to the precise construction herein disclosed and the right is reserved to all changes and modifications coming within the scope of the invention as defined by the appended claims.

I claim:

1. A semiconductor memory cell comprising:
   a semiconductor substrate of a first conductivity type;
   a pair of regions of a second conductivity type defining a channel region of a field effect transistor therebetween;
   a first insulating layer on said channel region;
   a gate electrode on said first insulating layer;
   an impurity region of the second conductivity type connected to one of said pair of regions to form the bottom plate of a diffusion store capacitor, with said bottom plate being at either a first or a second voltage level depending upon the state of said memory cell;
   a second insulating layer on said impurity region;
   the thickness of said first insulating layer being greater than the thickness of said second insulating layer, and
   a conductive plate on said second insulating layer, said conductive plate being connected to a voltage level which is between the first and second voltage levels.

2. The memory of claim 1 wherein said second insulating layer is approximately half the thickness of said first insulating layer.

3. The memory of claim 1 wherein said first voltage level is zero volts and said second voltage level is the memory power supply voltage level minus the field effect transistor threshold voltage.

4. The memory cell of claim 1 wherein said voltage level between the first and second voltage levels is approximately midway therebetween.

5. The memory cell of claim 1 and further including a heavily doped region of said first conductivity type below said bottom plate.

6. A semiconductor memory cell comprising:
   a field effect transistor having a channel between a pair of controlled electrodes, a controlling electrode, and a gate dielectric layer between said channel and said controlling electrode,
   a diffusion store capacitor having a pair of plates and a capacitor dielectric layer therebetween, said gate dielectric layer being greater than the thickness of said capacitor dielectric layer, one of said plates being connected to one of said controlled electrodes to form a storage node, said storage node being at either a first voltage level or a second voltage level depending upon the binary state of said memory cell; and
   means for connecting the other of said capacitor plates to a voltage level which is between the first and second voltage levels.

7. The memory of claim 6 wherein said first voltage level is zero volts and said second voltage level is the memory power supply voltage level minus the field effect transistor threshold voltage.

8. The memory cell of claim 6 wherein said voltage level between the first and second voltage levels is approximately midway therebetween.

* * * * *